United States Patent
Chang et al.

(10) Patent No.: US 6,432,479 B2
(45) Date of Patent: Aug. 13, 2002

(54) METHOD FOR IN-SITU, POST DEPOSITION SURFACE PASSIVATION OF A CHEMICAL VAPOR DEPOSITED FILM

(75) Inventors: Mei Chang, Saratoga; Ramanujapuram A. Srinivas, San Jose; Li Wu, Fremont, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/182,955

(22) Filed: Oct. 29, 1998

Related U.S. Application Data

(63) Continuation-in-part of application No. 08/982,872, filed on Dec. 2, 1997, now abandoned.

(51) Int. Cl.[7] .............................................. C23C 16/34
(52) U.S. Cl. ................................ 427/255.394; 427/535
(58) Field of Search ................................ 427/535, 569, 427/561, 255.394, 255.7

(56) References Cited

U.S. PATENT DOCUMENTS

| | | | |
|---|---|---|---|
| 3,656,995 A | * 4/1972 | Reedy, Jr. ............ | 427/255.394 |
| 4,151,325 A | 4/1979 | Welch | |
| 4,243,865 A | 1/1981 | Saxena | |
| 4,557,943 A | 12/1985 | Rosler et al. | |
| 4,678,679 A | 7/1987 | Ovshinsky | |
| 4,701,349 A | 10/1987 | Koyanagi et al. | |
| 4,718,976 A | 1/1988 | Fujimura | |
| 4,835,005 A | 5/1989 | Hirooka et al. | |
| 5,062,900 A | * 11/1991 | Berneron et al. ........... | 427/569 |
| 5,141,613 A | 8/1992 | Adoncecchi et al. | |
| 5,292,555 A | * 3/1994 | Preisser .................... | 427/255.4 |
| 5,296,404 A | 3/1994 | Akahori et al. | |
| 5,326,362 A | * 7/1994 | Shetty et al. ................ | 427/250 |
| 5,587,200 A | * 12/1996 | Lorenz et al. ........ | 427/255.391 |
| 5,593,511 A | 1/1997 | Foster et al. | |
| 5,709,958 A | 1/1998 | Toyoda et al. | |
| 5,736,458 A | 4/1998 | Teng | |
| 5,925,422 A | * 7/1999 | Vandenbulcke et al. . | 427/255.7 |
| 5,989,652 A | * 11/1999 | Ameen et al. ............... | 427/585 |

FOREIGN PATENT DOCUMENTS

| | | |
|---|---|---|
| DE | 196 45 033 A1 | 11/1995 |
| EP | 0 802 563 A2 | 10/1997 |
| EP | 0 855 452 A1 | 7/1998 |

\* cited by examiner

*Primary Examiner*—Bret Chen
(74) *Attorney, Agent, or Firm*—Moser, Patterson & Sheridan LLP.

(57) ABSTRACT

Method for passivating a layer of titanium that has been deposited on a substrate in a reaction chamber to coat the titanium thereby reducing the likelihood of contamination by byproducts of the deposition process or ambient oxygen or similar reactants. The method includes adding a flow of hydrogen and a flow of nitrogen to the chamber. The flows of hydrogen and nitrogen are approximately 800 sccm and continue for approximately 10–30 seconds respectively. The method may further comprise the step of forming a nitrogen plasma in the chamber for approximately 10 seconds wherein such case the flows of hydrogen and nitrogen continue for approximately 8 seconds respectively. The plasma is formed by applying RF power to an electrode located within said chamber or by a remote plasma source and channeled to said reactor chamber. Alternately, the passivation layer may be formed just by using a nitrogen plama alone for approximately 10–30 seconds at the same RF power level. The plasma in either case may further comprise hydrogen and argon and the layer of titanium has been deposited by CVD.

11 Claims, 10 Drawing Sheets

FIG. 6

TABLE 1
PREFERRED CVD TITANIUM PROCESS

| | STEP 310 | STEP 315 | STEP 320 | STEP 325 | STEP 330 | STEP 335 | STEP 340 | STEP 345 | STEP 350 | STEP 355 | STEP 360 |
|---|---|---|---|---|---|---|---|---|---|---|---|
| PRESSURE (torr) | 60 | TFO | 5 | 5 | 5 | 5 | 1.5 | 1.5 | 1.5 | TFO | TFO |
| SPACING (mil) | 329 | 329 | 329 | 329 | 329 | 329 | 329 | 329 | 329 | 329 | 329 |
| RF POWER (W) | 0 | 0 | 0 | 900 | 900 | 900 | 50 | 0 | 600 | 50 | 0 |
| Ar (bottom) (sccm) | 500 | 500 | 500 | 500 | 500 | 500 | 500 | 500 | 500 | 500 | 0 |
| Ar (top) (sccm) | 2000 | 5000 | 7500 | 10000 | 10000 | 10000 | 500 | 500 | 500 | 500 | 0 |
| $H_2$ (sccm) | 0 | 1000 | 3000 | 5000 | 5000 | 5000 | 0 | 800 | 800 | 800 | 0 |
| He (sccm) | 0 | 0 | 0 | 100 (divert) | 100 (divert) | 100 | 0 | 0 | 0 | 0 | 0 |
| $TiCl_4$ (mgm) | 0 | 0 | 0 | 400 (divert) | 400 (divert) | 400 | 0 | 0 | 0 | 0 | 0 |
| $N_2$ (sccm) | 0 | 0 | 0 | 0 | 0 | 0 | 0 | 800 | 800 | 800 | 0 |

*TFO=Throttle valve fully open

FIG. 7

TABLE 2

PREFERRED CVD TITANIUM CLEAN PROCESS

| | STEP 375 | STEP 380 | STEP 385 | STEP 390 | STEP 395 | STEP 400 |
|---|---|---|---|---|---|---|
| PRESSURE (torr) | TFO | 0.8 | 0.8 | 0.6 | 4 | TFO |
| SPACING (mil) | 650 | 600 | 600 | 600 | 650 | 650 |
| RF POWER (W) | 0 | 0 | 400 | 0 | 0 | 0 |
| Ar (bottom) (sccm) | 200 | 200 | 200 | 200 | 500 | 0 |
| Ar (top) (sccm) | 0 | 0 | 0 | 0 | 0 | 0 |
| $H_2$ (sccm) | 0 | 0 | 0 | 0 | 0 | 0 |
| He (sccm) | 500 (TiCl$_4$ line) | 500 (TiCl$_4$ line) | 500 (TiCl$_4$ line) | 500 (TiCl$_4$ line) | 500 (TiCl$_4$ line) | 0 |
| TiCl$_4$ (mgm) | 0 | 0 | 0 | 0 | 0 | 0 |
| $N_2$ (sccm) | 500 | 500 | 500 | 500 | 500 | 0 |
| Cl$_2$ (sccm) | 0 | 250 | 250 | 0 | 0 | 0 |

METHOD FOR IN-SITU, POST DEPOSITION SURFACE PASSIVATION OF A CHEMICAL VAPOR DEPOSITED FILM

CROSS-REFERENCE TO RELATED APPLICATIONS

This application is a continuation-in-part of U.S. patent application Ser. No. 08/982,872, filed Dec. 2, 1997, now abandoned.

BACKGROUND OF THE INVENTION

1. Field of the Invention

The present invention relates to the fabrication of integrated circuits and the deposition of film layers over a semiconductor substrate. More specifically, the present invention relates to an improved chemical vapor deposition method and apparatus for depositing and treating a titanium layer having improved sheet resistance uniformity and excellent bottom coverage at contacts.

2. Description of the Background Art

One of the primary steps in fabricating modern semiconductor devices is forming various layers, including dielectric layers and metal layers, on a semiconductor substrate. As is well known, these layers can be deposited by chemical vapor deposition (CVD) or physical vapor deposition (PVD) among other methods. In a conventional thermal CVD process, reactive gases are supplied to the substrate surface where heat-induced chemical reactions take place to produce a desired film. In a conventional plasma CVD process, a controlled plasma is formed to decompose and/or energize reactive species to produce the desired film. In general, reaction rates in thermal and plasma processes may be controlled by controlling one or more of the following: temperature, pressure, plasma density, reactant gas flow rate, power frequency, power levels, chamber physical geometry, and others.

Increasingly stringent requirements for fabricating these high integration devices are needed and conventional substrate processing systems are becoming inadequate to meet these requirements. Additionally, as device designs evolve, more advanced capabilities are required in substrate processing systems used to deposit films having the properties that are required to implement these devices. For example, the use of titanium is increasingly being incorporated into integrated circuit fabrication processes. Titanium has many desirable characteristics for use in a semiconductor device. Titanium can act as a diffusion barrier between, for example, a gold bonding pad and a semiconductor, to prevent migration of one atomic species into the next. Also, titanium can be used to improve the adhesion between two layers, such as between silicon and aluminum. Further, use of titanium, which forms titanium silicide ($TiSi_x$) when alloyed with silicon, can enable, for example, formation of ohmic contacts. One common type of deposition system used for depositing such a titanium film is a titanium sputtering or physical vapor deposition (PVD) system. Such sputtering systems are often inadequate, however, for forming devices with higher processing and manufacturing requirements. Specifically, sputtering may damage previously deposited layers and structures in such devices creating performance and/or yield problems. Also, titanium sputtering systems may be unable to deposit uniform conformal layers in high aspect ratio gaps because of shadowing effects that occur with sputtering.

In contrast to sputtering systems, a plasma-enhanced chemical vapor deposition (PECVD) system may be more suitable for forming a titanium film on substrates with high aspect ratio gaps. As is well known, a plasma, which is a mixture of ions and gas molecules, may be formed by applying energy, such as radio frequency (RF) energy, to a process gas in the deposition chamber under the appropriate conditions, for example, chamber pressure, temperature, RF power, and others. The plasma reaches a threshold density to form a self-sustaining condition, known as forming a glow discharge (often referred to as "striking" or "igniting" the plasma). This RF energy raises the energy state of molecules in the process gas and forms ionic species from the molecules. Both the energized molecules and ionic species are typically more reactive than the process gas, and hence more likely to form the desired film. Advantageously, the plasma also enhances the mobility of reactive species across the surface of the substrate as the titanium film forms, and results in films exhibiting good gap filling capability.

One known CVD method of depositing titanium films includes forming a plasma from a process gas that includes a $TiCl_4$ source gas and a hydrogen ($H_2$) reactant gas in a standard PECVD process. Such $TiCl_4/H_2$ PECVD processes result in the deposition of a titanium film that has good via-fill, uniformity and contact resistance properties making the film appropriate for use in the fabrication of many different commercially available integrated circuits. However, the high energy and temperatures associated with PECVD also increases the reaction rate of contaminants such as carbon and oxygen at the wafer surface during the deposition process. Additionally, surface titanium may react (oxidize) with ambient oxygen as a wafer is transferred between process chambers. As such, the deposited titanium may contain impurities which alter (increase) the resistance of the deposited layer and render devices constructed therefrom defective or inoperable.

Therefore, there is a need in the art for a suitable method of treating deposited layers such as titanium so as to protect them from contaminants during the fabrication process.

SUMMARY OF THE INVENTION

The present invention provides an improved CVD deposition and treatment process for titanium films. According to the method of the present invention, a passivating layer for a titanium layer that has been deposited on a substrate in a reaction chamber is formed by adding a flow of hydrogen and a flow of nitrogen to the chamber. The flows of hydrogen and nitrogen are approximately 800 sccm and continue for approximately 10–30 seconds respectively. The method may further comprise the step of forming a nitrogen plasma in the chamber for approximately 10 seconds wherein such case the flows of hydrogen and nitrogen continue for approximately 8 seconds respectively. The plasma is formed by applying RF power to an electrode located within said chamber or by a remote plasma source and channeled to said reactor chamber. Alternately, the passivation layer may be formed just by using a nitrogen plama alone for approximately 10–30 seconds at the same RF power level. The plasma in either case may further comprise hydrogen and argon and the layer of titanium has been deposited by CVD.

Additionally, in a semiconductor wafer processing system comprising a reactor chamber for processing a semiconductor wafer onto which a layer of titanium has been deposited and a processor for controlling the operation of said reactor chamber, a processor readable medium containing a program that, when executed by said processor, causes said reactor chamber to passivate said layer of titanium by adding a flow of nitrogen and a flow of hydrogen to said reactor chamber in the presence of said semiconductor wafer. The processor readable medium further contains a program that, when executed by said processor, causes the reactor chamber to passivate said layer of titanium by forming a nitrogen plasma in said reactor chamber in the presence of said semiconductor wafer wherein said flow of nitrogen and hydrogen continues for approximately 10–30 seconds.

In accordance with the method of the present invention, a passivation layer is formed over the titanium layer, for example a titanium nitride layer. The passivation layer coats the titanium thereby reducing the likelihood of contamination by byproducts of the deposition process or ambient oxygen or similar reactants that may otherwise attack and alter the stability of the resultant deposited film.

BRIEF DESCRIPTION OF THE DRAWINGS

The teachings of the present invention can be readily understood by considering the following detailed description in conjunction with the accompanying drawings, in which:

FIG. 6 depicts a table (Table 1) of data for practicing a preferred CVD of titanium process of the subject invention and FIG. 7 depicts a table (Table 2) of data for practicing a preferred CVD of titanium clean process of the subject invention.

To facilitate understanding, identical reference numerals have been used, where possible, to designate identical elements that are common to the figures.

DETAILED DESCRIPTION OF PREFERRED EMBODIMENTS

I. Introduction

The present invention allows for deposition of an improved titanium film by pretreating a substrate in which the titanium film is to be deposited over with a pretreatment plasma step. The present inventors discovered that such a plasma pretreatment step is particularly useful when the deposited titanium layer is used as part of a multilayer stack (e.g., a titanium/titanium nitride stack) used to make an ohmic contact to a semiconductor substrate in a contact area etched through a dielectric layer such as a silicon oxide layer. The plasma pretreatment step etches any residual dielectric material left in the contact area of the substrate and cleans the contact area prior to deposition of the titanium layer. After completion of the plasma pretreatment step, the titanium layer can be deposited by introducing a titanium-containing source gas while maintaining the previously formed plasma. Titanium layers deposited by the method of the present invention are suitable for use in the fabrication of integrated circuits having feature sizes of 0.35 to 0.11 microns or less. Also, the present invention can be used to deposit titanium films in CVD chambers of conventional design using readily available gases. Finally, after depositing titanium, a post-deposition passivation step is conducted. The passivation step forms a protective layer over the titanium to reduce contamination of the deposited film.

II. Exemplary CVD Chamber

Figure 1A:
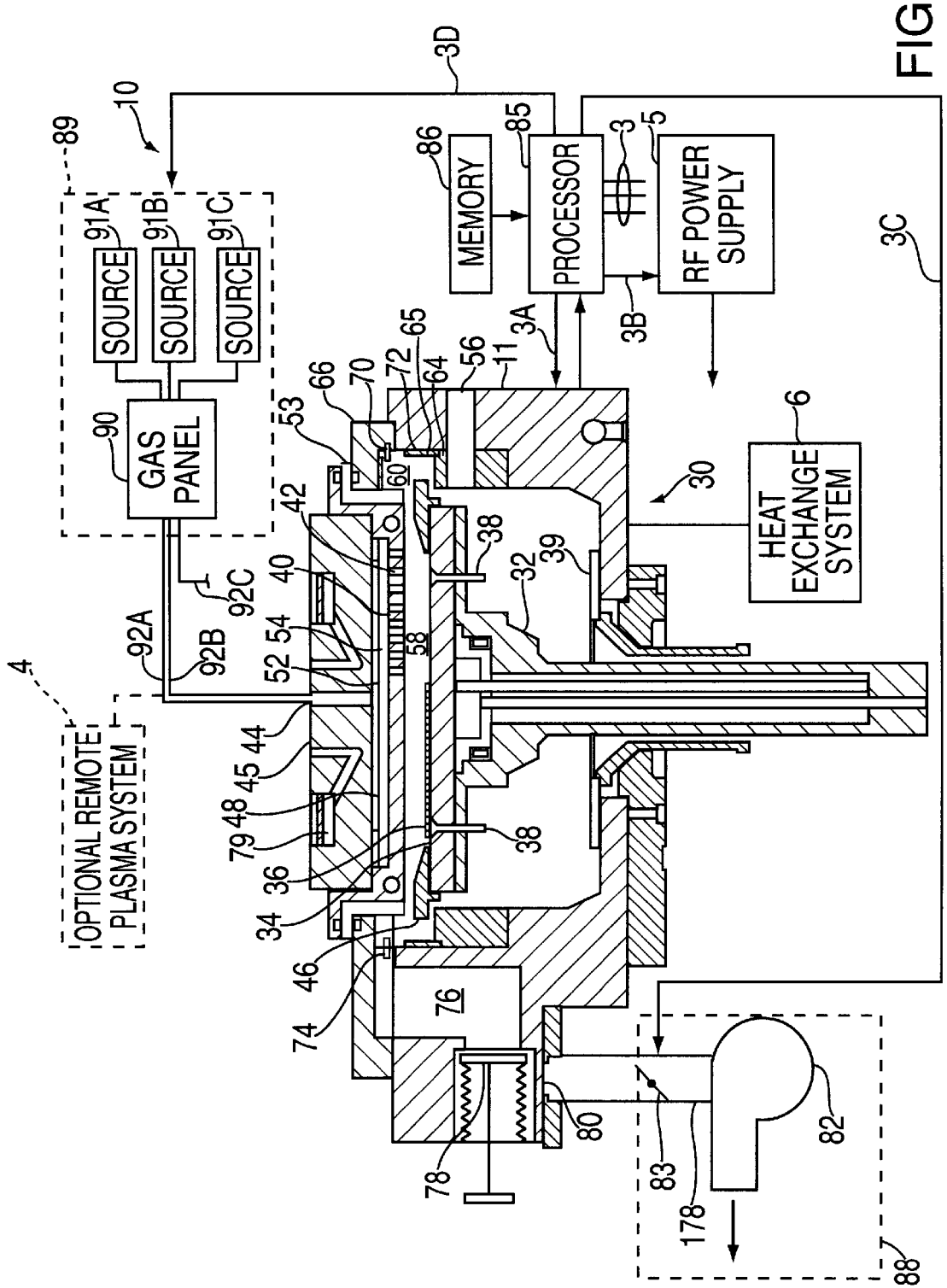
FIG. 1A is a vertical, cross-sectional view of one embodiment of a simplified plasma enhanced chemical vapor deposition system according to the present invention.

FIG. 1A illustrates one embodiment of a simplified, parallel plate chemical vapor deposition (CVD) system 10 in which the titanium layer according to the present invention may be deposited. CVD system 10 includes a reactor chamber 30, which receives gases from a gas delivery system 89 via gas lines 92A–C (other lines may be present but not shown). A vacuum system 88 is used to maintain a specified pressure in the chamber and removes gaseous byproducts and spent gases from the chamber. A power supply 5 provides power to the chamber to form a plasma from the deposition gas during titanium deposition and from the chamber cleaning gas during a chamber clean operation. In a preferred embodiment of the invention, the power supply 5 is capable of providing AC power in the range of approximately 300 Khz–2.5 Ghz and preferably in the radio-frequency range of approximately 300–450 Khz. A heat exchange system 6 employs a liquid heat transfer medium, such as water or a water-glycol mixture, to remove heat from the reactor chamber and keep certain portions of the chamber suitably cool in order to maintain a chamber temperature for stable process temperatures, or to heat portions of the chamber, if necessary. A processor 85 controls the operation of the chamber and sub-systems according to instructions stored in a memory 86 via control lines 3, 3A–D (only some of which are shown).

Gas delivery system 89 includes gas supply panel 90 and gas or liquid sources 91A–C (additional sources may be added if desired), containing gases or liquids that may vary depending on the desired processes used for a particular application. Liquid sources may be held at temperature much greater than room temperature to minimize source temperature variations due to changes in the room temperature. Gas supply panel 90 has a mixing system which receives the deposition process and carrier gases (or vaporized liquids) from the sources 91A–C for mixing and sending to a central gas inlet 44 in a gas feed cover plate 45 via supply lines 92A–C. Liquid sources may be heated to provide a vapor at a pressure above the chamber operating pressure, or a carrier gas, such as He, Ar, or $N_2$ may be bubbled through the liquid (or heated liquid) to produce a vapor. Generally, the supply line for each of the process gases includes a shut-off valve (not shown) that can be used to automatically or manually shut off the flow of process gas, and a mass flow controller (not shown) that measures the flow of gas or liquid through the supply lines. When toxic gases (for example, ozone or halogenated gas) are used in the process, the several shut-off valves may be positioned on each gas supply line in conventional configurations. The rate at which the deposition and carrier gases including, for example, titanium tetrachloride ($TiCl_4$) vapor, hydrogen ($H_2$), helium (He), argon (Ar), and nitrogen ($N_2$) and/or other dopant or reactant sources, are supplied to the reaction chamber 30 is also controlled by liquid or gas mass flow controllers (MFCs) (not shown) and/or by valves (not shown). In preferred embodiments, a gas mixing system (not shown) includes a liquid injection system for vaporizing reactant liquids (e.g., $TiCl_4$). A liquid injection system is preferred as it provides greater control of the volume of reactant liquid introduced into the gas mixing system compared to bubbler-type sources. The vaporized gases are then mixed in the gas panel with a carrier gas, such as helium, before being delivered to the supply line. Of course, it is recognized that other compounds may be used as deposition sources.

The heat exchange system 6 delivers coolant to various components of the chamber 30 to cool these components during the high temperature processing. The heat exchange system 6 acts to decrease the temperature of these chamber components in order to minimize undesired deposition onto these components due to the high temperature processes. The heat exchange system 6 includes connections (not shown) that supply cooling water through a coolant manifold (not shown) for delivering coolant to the gas distribution system, including the faceplate 40, (discussed below). A waterflow detector detects the waterflow from a heat exchanger (not shown) to enclosure assembly.

Figure 1B:
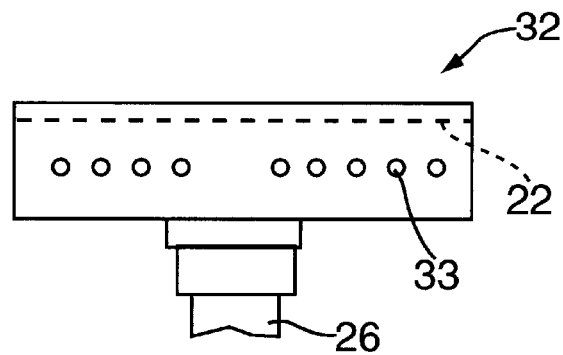
FIG. 1B shows a simplified cross-sectional view of ceramic pedestal 36 shown in FIG. 1A according to one embodiment of the present invention.

A resistively-heated pedestal 32 supports a wafer 36 in a wafer pocket 34. As shown in FIG. 1B, which is a simplified cross-sectional view of pedestal 32, pedestal 32 includes an embedded electrode 22, such as an embedded molybdenum mesh, and a heating element 33, such as an embedded molybdenum wire coil. Pedestal 32 is preferably made from aluminum nitride in order to withstand high processing temperatures and is preferably diffusion bonded to a ceramic support stem 26 that is secured to a water cooled aluminum shaft 28 (not shown in FIG. 1B, but shown in FIG. 1C) that engages a lift motor. The ceramic support stem 26 and the aluminum shaft 28 have a central passage that is occupied by a nickel rod 25 that grounds electrode 22. The central passage is maintained at atmospheric pressure to avoid corrosive attacks at the metal-to-metal connections.

Ceramic pedestal 32 is manufactured to provide uniform capacitance by embedding RF electrode 22 at a uniform depth below the surface of the substrate holder. RF electrode 22 is preferably positioned at a minimum depth, which depends on the ceramic material, to provide maximum capacitance while avoiding cracking or flaking of the thin ceramic layer which covers the RF electrode 22. In one embodiment, RF electrode 22 is embedded about 40 mil beneath the upper surface of pedestal 32. Further details of ceramic pedestal 32 are set forth in commonly assigned U.S. patent application Ser. No. 08/980,520, filed on Dec. 1, 1997, entitled "Mixed Frequency CVD Process And Apparatus," having Sebastien Raoux, Mandar Mudholkar, William N. Taylor, Mark Fodor, Judy Huang, David Silvetti, David Cheung, Kevin Fairbairn listed as co-inventors, which is hereby incorporated by reference in its entirety.

Pedestal 32 may be moved vertically between a processing position (shown in FIG. 1C) and a lower loading position (not shown) using a self-adjusting mechanism, which is described in detail in commonly assigned U.S. patent application Ser. No. 08/738,240, filed on Oct. 25, 1996, and entitled "Self-Aligning Lift Mechanism," the disclosure of which is herein incorporated by reference. Referring to FIG. 1C, lift pins 38 (only two of which are shown) are slidable within pedestal 32 but are kept from falling out by conical heads on their upper ends. The lower ends of the lift pins 38 may be engaged with a vertically movable lifting ring 39 and thus can be lifted above the pedestal's surface. With the pedestal 32 in the lower loading position (slightly lower than a slit valve 56), a robot blade (not shown) in cooperation with the lift pins and the lifting ring transfers the wafer 36 in and out of the chamber 30 through the slit valve 56, which can be vacuum-sealed to prevent the flow of gas into or out of the chamber through the slit valve 56. The lift pins 38 raise an inserted wafer (not shown) off the robot blade, and then the pedestal rises to raise the wafer off the lift pins onto the wafer pocket on the upper surface of the pedestal. A suitable robotic transfer assembly is described in commonly assigned U.S. Pat. No. 4,951,601 to Maydan, the complete disclosure of which is incorporated herein by reference.

The pedestal 32 then further raises the wafer 36 into the processing position, which is in close proximity to a gas distribution faceplate (hereinafter "showerhead") 40, which includes a large number of holes or passageways 42 for jetting the process gas into the process zone 58. The process gas is injected into the chamber 30 through central gas inlet 44 in gas-feed cover plate 45 to a first disk-shaped manifold 48 and from thence through passageways 50 in a baffle plate (or blocker plate) 52 to a second disk-shaped manifold 54.

As indicated by the arrows, the process gas jets from holes 42 in showerhead 40 into processing zone 58 (also preferred to as the "deposition zone") between the showerhead and the pedestal, so as to react at the surface of the wafer 36. The process gas byproducts then flow radially outward across the edge of wafer 36 and across a flow restrictor ring 46 (described in more detail below), which is disposed on the upper periphery of pedestal 32 when the pedestal is in the processing position. From thence, the process gas flows through a choke aperture 50 formed between the top of flow restrictor ring 46 and the bottom of an annular isolator 53 into pumping channel 60. Upon entering pumping channel 60, the exhaust gas is routed around the perimeter of the process chamber, to be evacuated by the vacuum pump 82. Pumping channel 60 is connected through exhaust aperture 74 to pumping plenum 76. Exhaust aperture 74 restricts the flow between the pumping channel and the pumping plenum. A valve 78 gates the exhaust through exhaust vent 80 to vacuum pump 82. The system controller (not shown in this view) controls a throttle valve 83 according to a pressure control program stored in memory (not shown) which compares a measured signal from a pressure sensor (not shown), such as a manometer, against a desired value which is stored in memory or generated according to the control program.

The sides of annular pumping channel 60 generally are defined by ceramic ring 64, a chamber lid liner 70, a chamber wall liner 72, and annular isolator 53. FIG. 1E is a simplified, partially-sectioned, perspective view of pedestal 32, flow restrictor ring 46, liners 70 and 72, isolator 53, ceramic ring 64, and pumping channel 60. This figure shows the flow of processing gas out of nozzles 42 in showerhead 40 towards wafer 36, then radially outward flow 84 over wafer 36. Thereafter, the gas flow is deflected upwardly over the top of restrictor ring 46 into pumping channel 60. In pumping channel 60, the gas flows along circumferential path 86 towards the vacuum pump.

Pumping channel 60 and its components are designed to minimize the effects of unwanted film deposition by directing the process gas and byproducts into the exhaust system. The exhaust flow form "dead zones" where little gas movement occurs. These dead zones approximate a purge gas blanket in that they displace reactive gases in that area and reduce unwanted depositions. Also, purge gas (e.g., argon) is introduced from gas nozzles (not shown) to blanket critical areas, such as ceramic parts and the heater edge and backside to further reduce unwanted deposition on those areas.

Unwanted deposition on the pedestal and other parts of the chamber is minimized in other ways. Specifically, flow restrictor ring 46 minimizes gas flow beyond the pedestal to the bottom of the chamber. In accordance with embodiments of the present invention, deposition of titanium using $TiCl_4$ (as described in further detail below) has flow rates significantly higher than conventional methods used in conventional deposition systems for forming other titanium films. In a preferred embodiment suitable for titanium deposition, flow restrictor ring 46 is made of fused silica because this material has relatively low thermal conductivity and because it is not electrically conductive. In another embodiment, the flow restrictor ring may be made of titanium for a deposition process for a titanium containing layer because the ring material will not contaminate the deposited layer.

In various embodiments, the restrictor ring covers portions of the top and edge of the pedestal, so that any undesired films deposit on the ring, instead of on the pedestal or on the bottom of the chamber. Advantageously, the flow restrictor ring minimizes the risk of unwanted deposition (with its associated problems) that might otherwise occur with this higher flow rate. Chamber lid 66 may be easily removed for cleaning, enabling access to the relatively inexpensive restrictor ring, which may then be lifted out and thoroughly cleaned using chemical and/or mechanical processes.

Referring again to FIG. 1A, flow restrictor ring 46 is supported by pedestal 32 during processing, as mentioned above. When the pedestal is lowered for wafer unloading and loading, the restrictor ring sits on ceramic ring 64 in ledge 69. As the pedestal supporting the next wafer is raised into processing position, it picks up the flow restrictor ring. At the pressures used in the chamber for the titanium processes according to embodiments of the invention, gravity is sufficient to hold both the wafer (disposed in the wafer pocket) and the restrictor ring on the pedestal.

Motors and optical sensors (not shown) are used to move and determine the position of movable mechanical assemblies such as throttle valve 83 and pedestal 32. Bellows (not shown) attached to the bottom of pedestal 32 and chamber body 76 form a movable gas-tight seal around the pedestal. The pedestal lift system, motors, gate valve, plasma system, including an optional remote plasma system 4 (which may be used to provide chamber clean capability using a remote plasma formed using, for example, a microwave source), and other system components are controlled by processor 85 over control lines 3 and 3A–D, of which only some are shown.

The processor 85 executes system control software, which is a computer program stored in the memory 86 coupled to the processor 85. Preferably, the memory 86 may be a hard disk drive, but of course the memory 86 may be other kinds of memory. In addition to a hard disk drive (e.g., memory 86), the CVD apparatus 10 in a specific embodiment includes a floppy disk drive and a card rack. The processor 85 operates under the control of the system control software, which includes sets of instructions that dictate the timing, mixture of gases, gas flow, chamber pressure, chamber temperature, RF power levels, heater pedestal position, heater temperature and other parameters of a particular process. Other computer programs such as those stored on other memory including, for example, a floppy disk or other computer program product inserted in a disk drive or other appropriate drive, may also be used to operate processor 85. System control software will be discussed in detail below. The card rack contains a single-board computer, analog and digital input/output boards, interface boards and stepper motor controller boards. Various parts of CVD apparatus 10 conform to the Versa Modular European (VME) standard which defines board, card cage, and connector dimensions and types. The VME standard also defines the bus structure having a 16-bit data bus and 24-bit address bus.

Figure 1D:
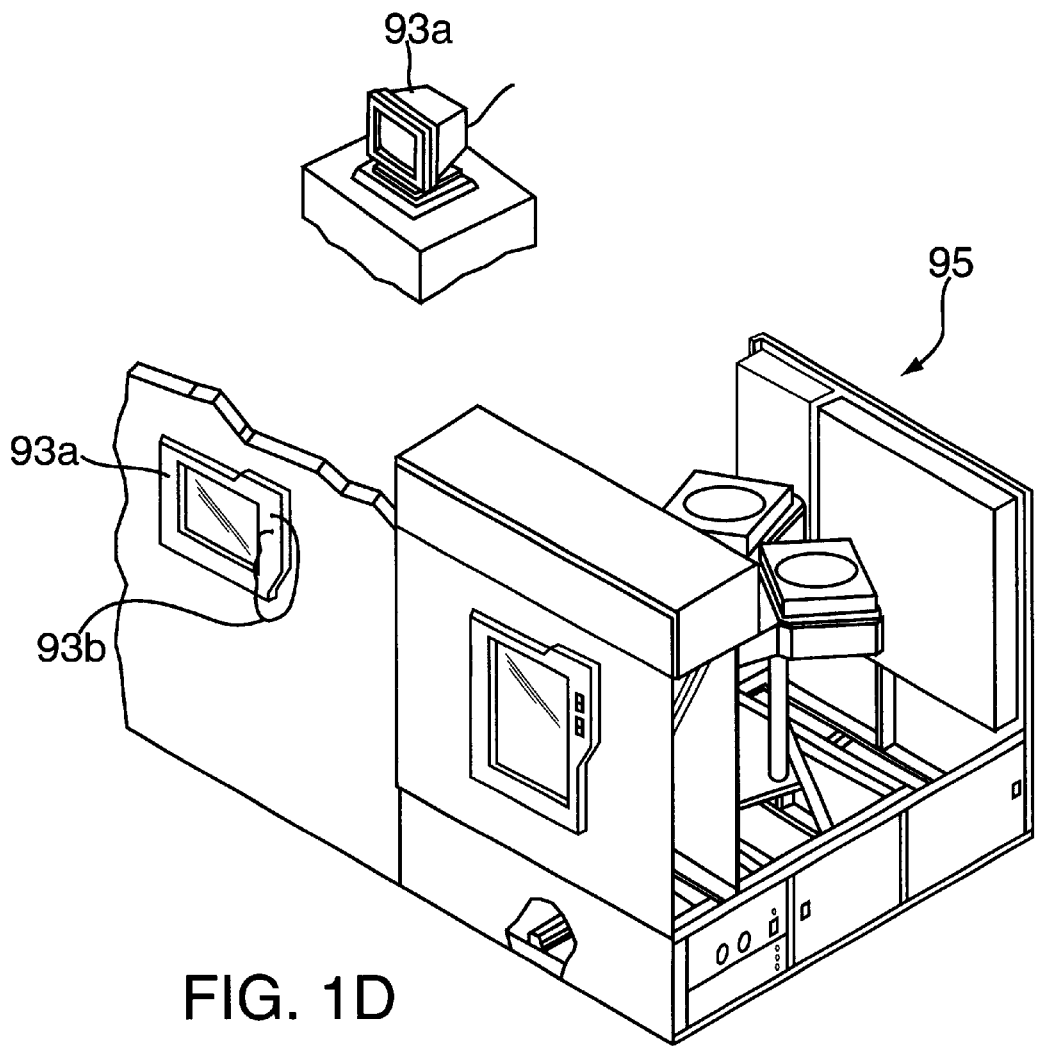
FIG. 1D shows an interface between a user and a processor that can control the deposition system of the present invention.
Figure 1C:
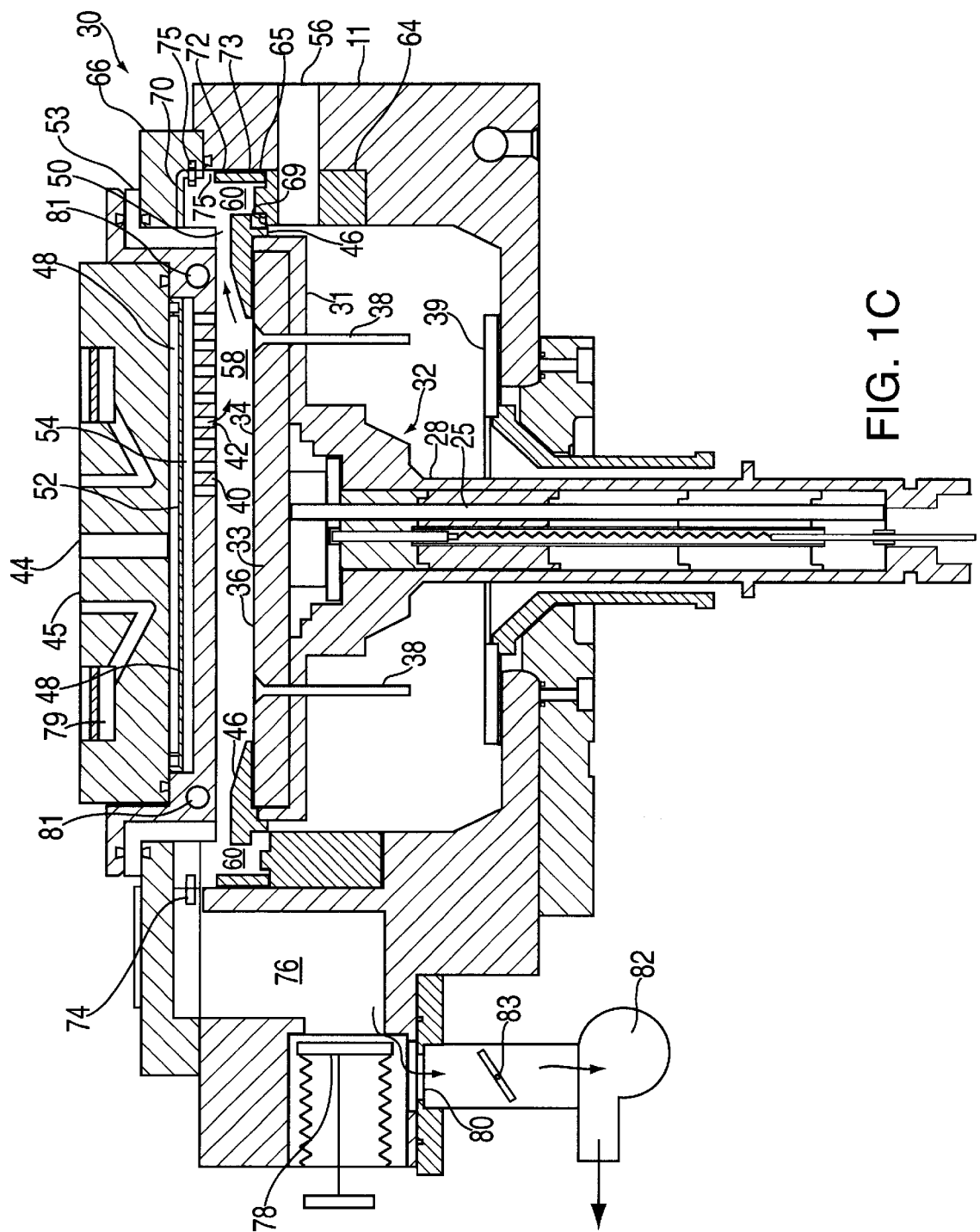
FIG. 1C is a simplified cross-sectional view of deposition chamber 30 shown in FIG. 1A, according to an embodiment of the present invention.
Figure 1E:
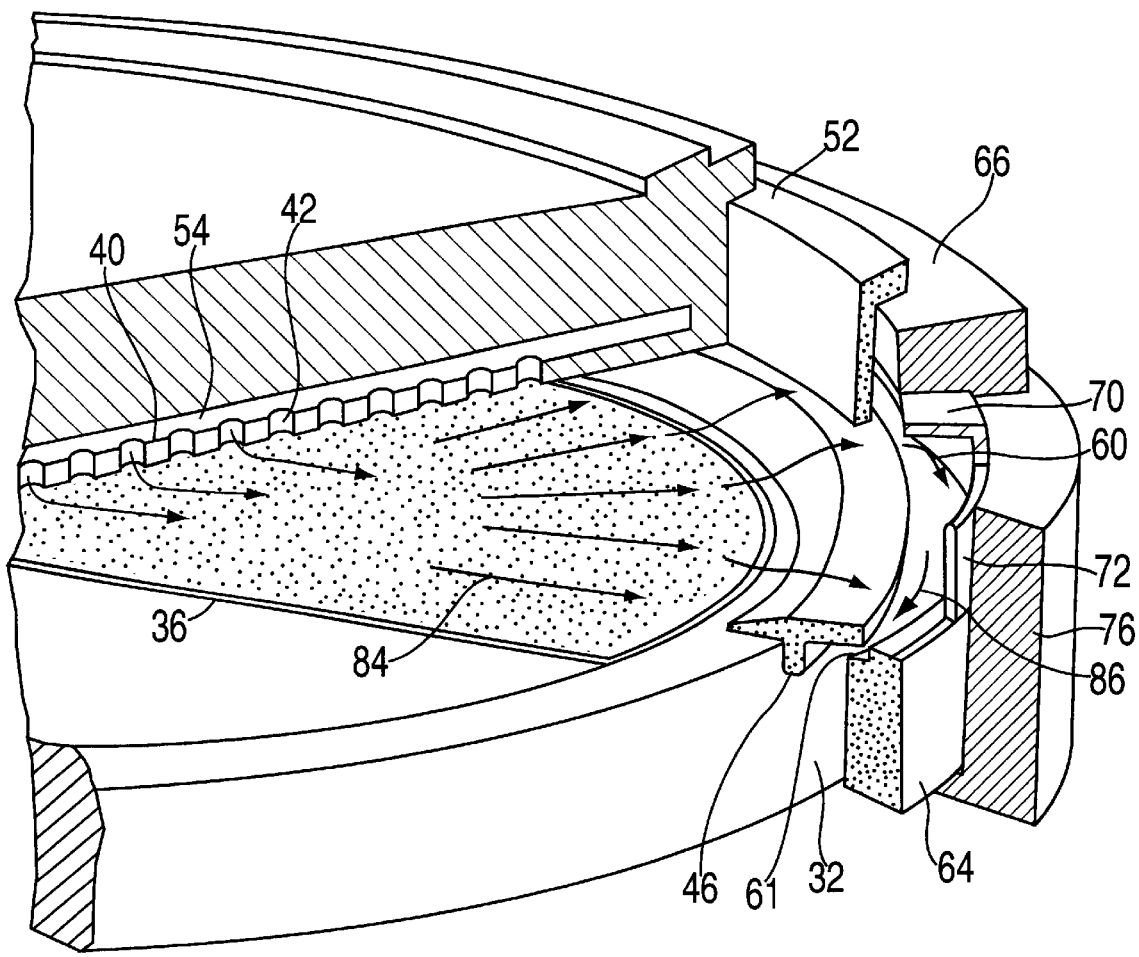
FIG. 1E shows a simplified, partially-sectioned perspective view of the flow of gas across a wafer and into the exhaust system according to one embodiment of the present invention.

The interface between a user and the processor 85 is via a CRT monitor 93a and a light pen 93b, shown in FIG. 1D which is a simplified diagram of the system monitor used with CVD apparatus 10, illustrated as one of the chambers in a multichamber system. CVD apparatus 10 is preferably attached to a mainframe unit 95 which contains and provides electrical, plumbing and other support functions for the apparatus 10. Exemplary mainframe units compatible with the illustrative embodiment of CVD apparatus 10 are currently commercially available as the Precision 5000J, the Centura 5200J and the Endura 5500J systems from Applied Materials, Inc. of Santa Clara, Calif. The multichamber system has the capability to transfer a wafer between its chambers without breaking the vacuum and without having to expose the wafer to moisture or other contaminants outside the multichamber system. An advantage of the multichamber system is that different chambers in the multichamber system may be used for different purposes in the entire process. For example, in a preferred embodiment of the present invention, one chamber is used for CVD deposition of a titanium film and another is used for CVD deposition of a titanium nitride film. In this manner, deposition of a titanium/titanium nitride stack, which is commonly used in the formation of contact structures as discussed with respect to FIG. 2A below, may proceed uninterrupted within the multichamber system, thereby preventing contamination of wafers that often occurs when transferring wafers between various separate individual chambers (not in a multichamber system) for different parts of the titanium/titanium nitride stack process.

In the preferred embodiment two monitors 93a are used, one mounted in the clean room wall for the operators and the other behind the wall for the service technicians. Both monitors 93a simultaneously display the same information, but only one light pen 93b is enabled. The light pen 93b detects light emitted by CRT display with a light sensor in the tip of the pen. To select a particular screen or function, the operator touches a designated area of the display screen and pushes the button on the pen 93b. The touched area changes its highlighted color, or a new menu or screen is displayed, confirming communication between the light pen and the display screen. Of course, other devices, such as a keyboard, mouse, or other pointing or communication device, may be used instead of or in addition to light pen 93b to allow the user to communicate with processor 85.

The processes for depositing the film and for dry cleaning the chamber is implemented using a computer program product that is executed by processor 85 (FIG. 1A). The computer program code can be written in any conventional computer readable programming language such as, for example, 68000 assembly language, C, C++, Pascal, Fortran, or other language. Suitable program code is entered into a single file, or multiple files, using a conventional text editor and is stored or embodied in a computer-usable medium, such as a memory system of the computer. If the entered code text is in a high-level language, the code is compiled, and the resultant compiler code is then linked with an object code of precompiled Windows library routines. To execute the linked compiled object code, the system user invokes the object code, causing the computer system to load the code in memory, from which the CPU reads and executes the code to perform the tasks identified in the program.

Figure 1F:
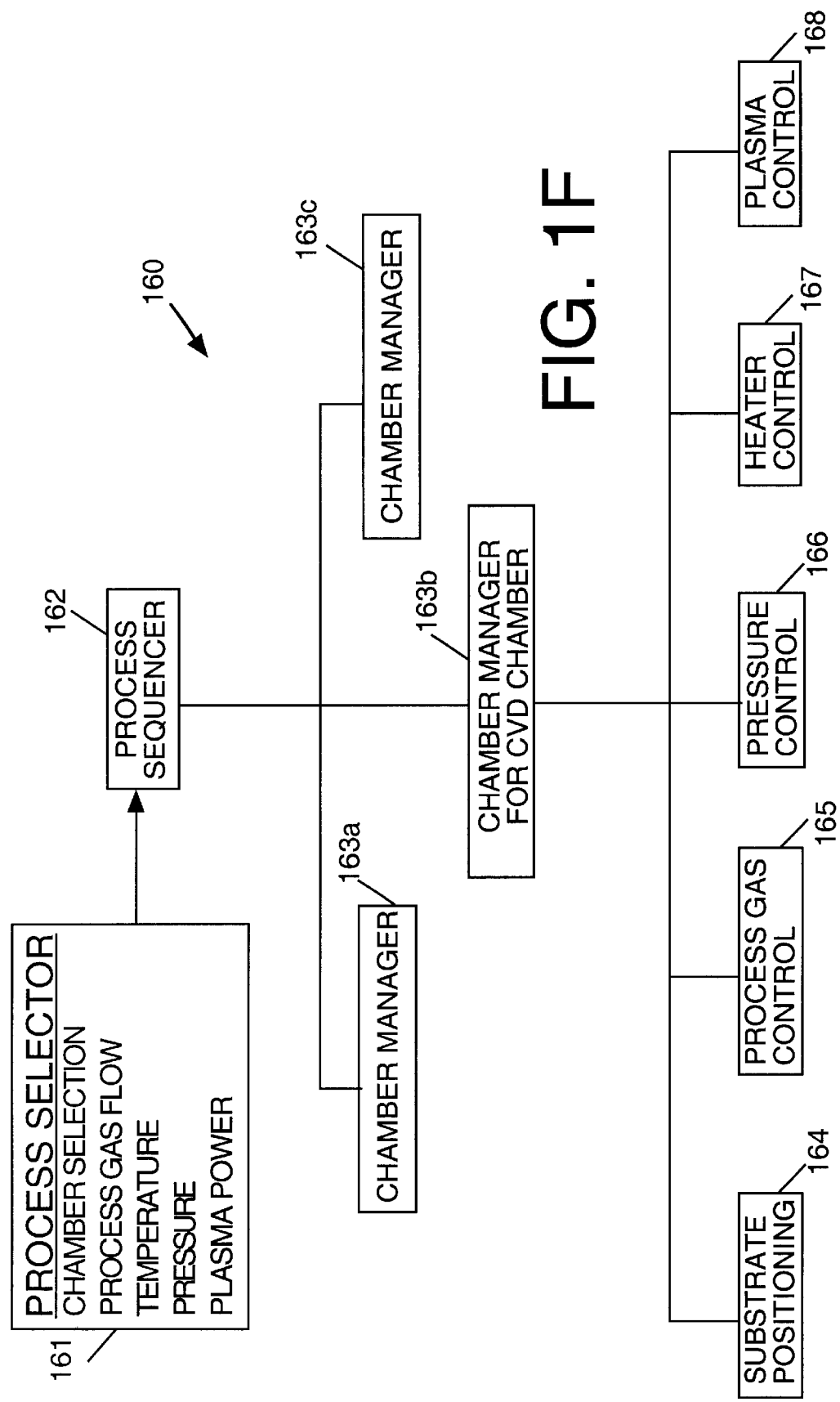
FIG. 1F shows an illustrative block diagram of the hierarchical control structure of the system control software, according to an embodiment of the present invention.

FIG. 1F is an illustrative block diagram of the hierarchical control structure of the system control software, computer program 160, according to a specific embodiment. Using a light pen interface, a user enters a process set number and process chamber number into a process selector subroutine 161 in response to menus or screens displayed on the CRT monitor. The process sets, which are predetermined sets of process parameters necessary to carry out specified processes, are identified by predefined set numbers. Process selector subroutine 161 identifies (i) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions such as high- and low-frequency RF power levels and the high-frequency and low-frequency RF frequencies, (and in addition, microwave generator power levels for embodiments equipped with remote microwave plasma systems) cooling gas pressure, and chamber wall temperature. Process selector subroutine 161 controls what type of process (deposition, wafer cleaning, chamber cleaning, chamber gettering, reflowing) is performed at a certain time in chamber 30. In some embodiments, there may be more than one process selector subroutine. The process parameters are provided to the user in the form of a recipe and may be entered utilizing the light pen/CRT monitor interface.

The signals for monitoring the process are provided by the analog input board and digital input board of the system controller, and the signals for controlling the process are output on the analog output board and digital output board of CVD system 10.

A process sequencer subroutine 162 comprises program code for accepting the identified process chamber and set of process parameters from process selector subroutine 161, and for controlling operation of the various process chambers. Multiple users can enter process set numbers and process chamber numbers, or a single user can enter multiple process set numbers and process chamber numbers, so sequencer subroutine 162 operates to schedule the selected processes in the desired sequence. Preferably, sequencer subroutine 162 includes program code to perform the steps of (i) monitoring the operation of the process chambers to determine if the chambers are being used, (ii) determining what processes are being carried out in the chambers being used, and (iii) executing the desired process based on availability of a process chamber and the type of process to be carried out. Conventional methods of monitoring the process chambers can be used, such as polling. When scheduling which process is to be executed, sequencer subroutine 162 can be designed to take into consideration the present condition of the process chamber being used in comparison with the desired process conditions for a selected process, or the "age" of each particular user-entered request, or any other relevant factor a system programmer desires to include for determining scheduling priorities.

Once sequencer subroutine 162 determines which process chamber and process set combination is going to be executed next, the sequencer subroutine 162 initiates execution of a the process set by passing the particular process set parameters to a chamber manager subroutine 163*a–c* which controls multiple processing tasks in a process chamber 30 according to the process set determined by sequencer subroutine 162. For example, the chamber manager subroutine 163*b* comprises program code for controlling CVD operations in process chamber 30. Chamber manager subroutine 163*b* also controls execution of various chamber component subroutines which control operation of the chamber components: necessary to carry out the selected process set. Examples of chamber component subroutines are substrate positioning subroutine 164, process gas control subroutine 165, pressure control subroutine 166, heater control subroutine 167, and plasma control subroutine 168. Depending on the specific configuration of the CVD chamber, some embodiments include all of the above subroutines, while other embodiments may include only some of the subroutines. Those having ordinary skill in the art would readily recognize that other chamber control subroutines can be included depending on what processes are to be performed in process chamber 30. In operation, chamber manager subroutine 163*b* selectively schedules or calls the process component subroutines in accordance with the particular process set being executed. Chamber manager subroutine 163*b* schedules the process component subroutines much like sequencer subroutine 162 schedules which process chamber 30 and process set are to be executed next. Typically, chamber manager subroutine 163*b* includes steps of monitoring the various chamber components, determining which components need to be operated based on the process parameters for the process set to be executed, and initiating execution of a chamber component subroutine responsive to the monitoring and determining steps.

Operation of particular chamber component subroutines shown in FIG. 1F will now be described with reference to FIG. 1A. Substrate positioning subroutine 164 comprises program code for controlling chamber components that are used to load the substrate onto pedestal 32 and, optionally, to lift the substrate to a desired height in chamber 30 to control the spacing between the substrate and showerhead 40. When a substrate is loaded into process chamber 30, heater assembly 33 is lowered to receive the substrate in wafer pocket 34, and then is raised to the desired height. In operation, substrate positioning subroutine 164 controls movement of pedestal 32 in response to process set parameters related to the support height that are transferred from chamber manager subroutine 163*b*.

Process gas control subroutine 165 has program code for controlling process gas composition and flow rates. Process gas control subroutine 165 controls the open/close position of the safety shut-off valves, and also ramps up/down the mass flow controllers to obtain the desired gas flow rate. Process gas control subroutine 165 is invoked by the chamber manager subroutine 163*b*, as are all chamber component subroutines, and receives subroutine process parameters related to the desired gas flow rates from the chamber manager. Typically, process gas control subroutine 165 operates by opening the gas supply lines and repeatedly (i) reading the necessary mass flow controllers, (ii) comparing the readings to the desired flow rates received from chamber manager subroutine 163*b*, and (iii) adjusting the flow rates of the gas supply lines as necessary. Furthermore, process gas control subroutine 163 includes steps for monitoring the gas flow rates for unsafe rates, and activating the safety shut-off valves when an unsafe condition is detected. Process gas control subroutine 165 also controls the gas composition and flow rates for clean gases as well as for deposition gases, depending on the desired process (clean or deposition or other) that is selected. Alternative embodiments could have more than one process gas control subroutine, each subroutine controlling a specific type of process or specific sets of gas lines.

In some processes, an inert gas such as nitrogen or argon is flowed into the chamber to stabilize the pressure in the chamber before reactive process gases are introduced. For these processes, process gas control subroutine 165 is programmed to include steps for flowing the inert gas into the chamber for an amount of time necessary to stabilize the pressure in the chamber, and then the steps described above would be carried out. Additionally, when a process gas is to be vaporized from a liquid precursor, for example $TiCl_4$, process gas control subroutine 165 would be written to include steps for bubbling a delivery gas, such as helium, through the liquid precursor in a bubbler assembly, or introducing a carrier gas, such as helium, to a liquid injection system. When a bubbler is used for this type of process, process gas control subroutine 165 regulates the flow of the delivery gas, the pressure in the bubbler, and the bubbler temperature in order to obtain the desired process gas flow rates. As discussed above, the desired process gas flow rates are transferred to process gas control subroutine 165 as process parameters. Furthermore, process gas control subroutine 165 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 166 comprises program code for controlling the pressure in the chamber 30 by regulating the aperture size of the throttle valve in the exhaust system of the chamber. The aperture size of the throttle valve is set to control the chamber pressure at a desired level in relation to the total process gas flow, the size of the process chamber, and the pumping set-point pressure for the exhaust system. When pressure control subroutine 166 is invoked, the desired or target pressure level is received as a parameter from chamber manager subroutine 163b. The pressure control subroutine 166 measures the pressure in chamber 30 by reading one or more conventional pressure manometers connected to the chamber, compares the measure value(s) to the target pressure, obtains proportional, integral, and differential (PID) values corresponding to the target pressure from a stored pressure table, and adjusts the throttle valve according to the PID values obtained from the pressure table. Alternatively, pressure control subroutine 166 can be written to open or close the throttle valve to a particular aperture size to regulate the pumping capacity in chamber 30 to the desired level.

Heater control subroutine 167 comprises program code for controlling the temperature of the heater coil 33 used to resistively heat pedestal 32 (and any substrate thereon). The heater control subroutine is also invoked by the chamber manager subroutine and receives a target, or set-point, temperature parameter. The heater control subroutine measures the temperature by measuring voltage output of a thermocouple located in pedestal 32, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. When an embedded loop is used to heat pedestal 32, heater control subroutine 167 gradually controls a ramp up/down of current applied to the loop. Additionally, a built-in fail-safe mode can be included to detect process safety compliance, and can shut down operation of the heating unit if the process chamber 30 is not properly set up. An alternative method of heater control which may be used utilizes a ramp control algorithm, which is described in the co-pending and commonly-assigned U.S. patent application Ser. No. 08/746,657, entitled "Systems and Methods for Controlling the Temperature of a Vapor Deposition Apparatus," listing Jonathan Frankel as inventor, filed on Nov. 13, 1996, the disclosure of which is hereby incorporated by reference.

A plasma control subroutine 168 comprises program code for setting low- and high-frequency RF power levels applied to the process electrodes in chamber 30 and heater assembly 32, and for setting the low RF frequency employed. Like the previously described chamber component subroutines, plasma control subroutine 168 is invoked by chamber manager subroutine 163b. For embodiments including a remote plasma generator 4, plasma control subroutine 168 would also include program code for controlling the remote plasma generator.

Further details of the above-described CVD system are set forth in commonly assigned U.S. patent application Ser. No. 08/918,706, filed on Aug. 22, 1997, and entitled "A High Temperature, High Deposition Rate Process and Apparatus for Depositing Titanium Layers," which is hereby incorporated by reference in its entirety. The above reactor description is, however, mainly for illustrative purposes, and other plasma CVD equipment such as electron resonance (ECR) plasma CVD devices, induction coupled RF high density plasma CVD devices, or the like may be employed. Additionally, variations of the above described system such as variations in pedestal design, heater design, pumping channel design, location of RF power connections and others are possible. The method for forming a titanium layer according to the present invention is not limited to any specific CVD apparatus.

III. An Improved CVD Titanium Process

The method of the present invention may be employed to deposit improved titanium films in a substrate processing chamber, such as the exemplary CVD chamber described above. As described above, titanium films have a number of uses in the fabrication of modern-day integrated circuits. One of the primary uses for such titanium films is as an initial adhesion layer in a titanium/titanium nitride stack that is part of a contact structure. Such a contact structure is shown in FIG. 2A, which is a cross-sectional view of an exemplary contact structure in which embodiments of the present invention may be employed.

Figure 2A:
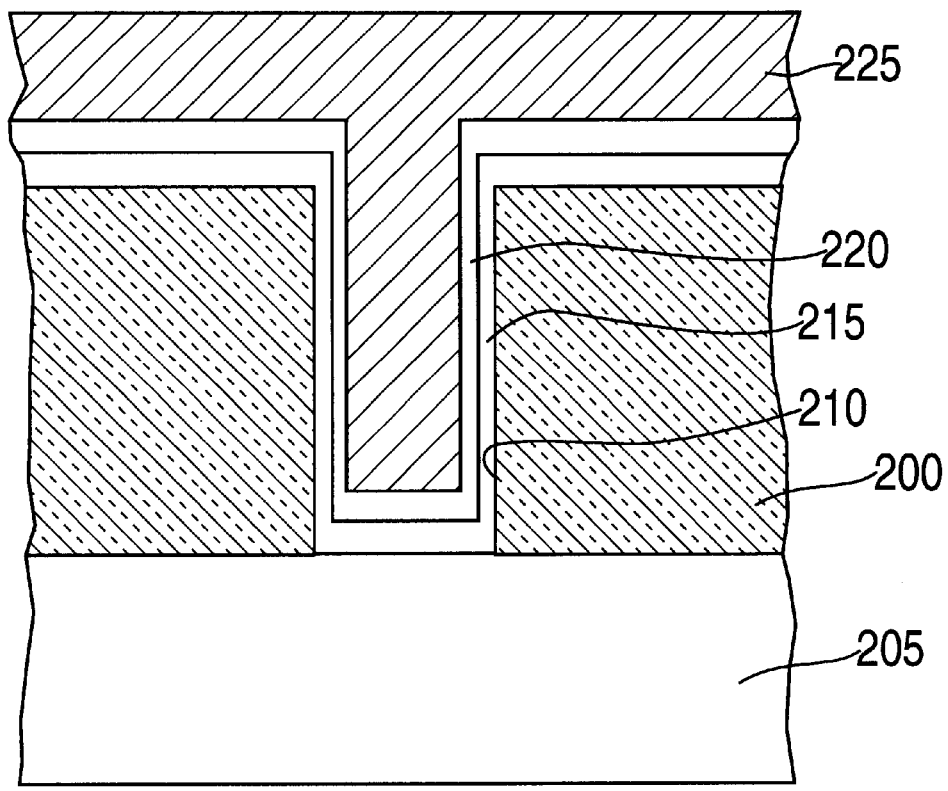
FIG. 2A shows a simplified cross-sectional view of an exemplary contact structure in which a titanium layer deposited according to the present invention may be employed.

As seen in FIG. 2A an oxide layer 200 (e.g., an $SiO_x$ film), is deposited to a thickness of about 1 fm over a substrate 205 having a surface of crystalline silicon or polysilicon. Oxide layer 200 may act as a pre-metal dielectric or as inter-level dielectric in an integrated circuit. In order to provide electrical contact between levels a contact hole 210 is etched through oxide layer 200 and filled with a metal such as aluminum.

In many advanced integrated circuits, contact hole 210 is narrow, often less than about 0.35 fm wide, and has an aspect ratio of about 6:1 or greater. Filling such a hole is difficult, but a somewhat standard process has been developed in which hole 210 is first conformally coated with a titanium layer 215. Titanium (Ti) layer 215 is then conformally coated with a titanium nitride (TiN) layer 220. Thereafter, an aluminum layer 225 is deposited, often by physical vapor deposition, to fill the contact hole 225 and to provide electrical interconnection lines on the upper level. Titanium layer 215 provides a glue layer to both the underlying silicon and the oxide on the sidewalls. Also, it can be silicided with the underlying silicon to form an ohmic contact. The TiN layer 220 bonds-well to the Ti layer 215, and the aluminum layer 225 wets well to the TiN so that the aluminum can better fill contact hole 210 without forming an included void. Also, TiN layer 220 acts as a diffusion barrier that prevents aluminum 225 from migrating into silicon 205 and affecting its conductivity.

To properly fulfill its purpose, titanium layer 215 must have excellent bottom coverage, low resistivity, uniform resistivity and uniform deposition thickness both across the entire bottom of the contact and across the entire wafer (center to edge) among other characteristics. Also, it is preferred that titanium layer 215 deposit uniformly along the bottom of contact 210, but not deposit at all along the sidewalls. Preventing titanium deposition on the sidewalls prevents the phenomenon known as "silicon creep" where silicon from the contact area reacts with titanium in the sidewall and is transported from the contact bottom up into the sidewall. Titanium layers deposited according to the method of the present invention meet all the above characteristics and exhibit markedly improved bottom coverage and sheet resistance uniformity as compared to prior art titanium deposition processes. These improvements are achieved through the incorporation of novel and unique steps that precede and follow the primary titanium bulk deposition step.

Figure 2B:
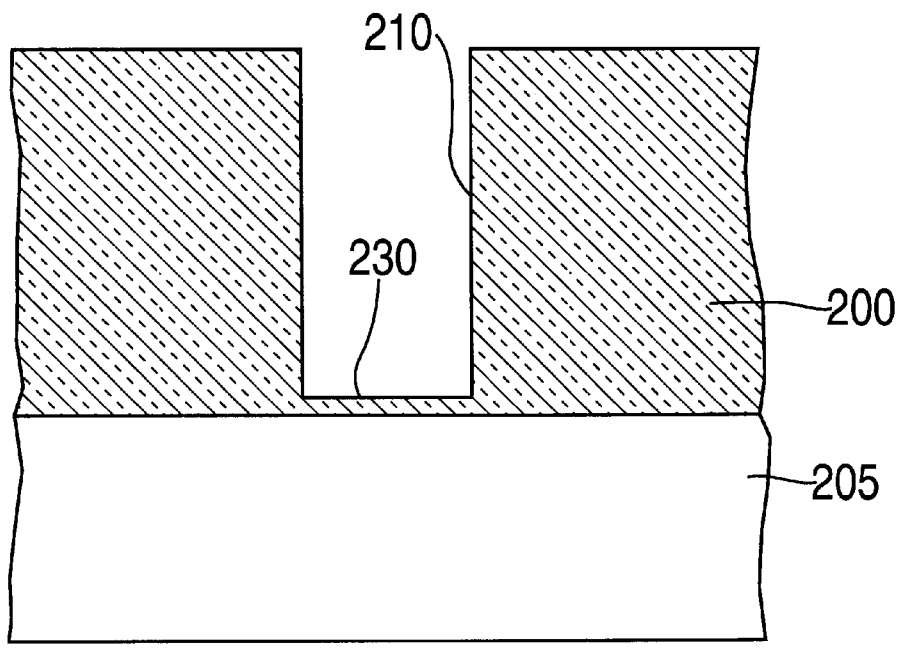
FIG. 2B is a simplified cross-sectional view illustrating the formation of a defect in the contact structure of FIG. 2A.

One of these steps is a novel and unique plasma treatment step that is performed before the titanium deposition step. In this plasma treatment step, the wafer is subjected to a relatively brief (e.g., between 5 and 60 seconds in preferred embodiments) plasma formed from a process gas of $H_2$ and Ar. In this manner, a small fraction of the top surface of the wafer is etched away prior to the deposition step. The inventors have found that this etching step is particularly beneficial in (1) removing any oxidation ($SiO_x$) that has grown in the contact area of the wafer after the formation of contact hole 210 and (2) further etching any silicon oxide from layer 200 that was unintentionally left in contact hole 210 after the hole formation (etching) step. The formation of oxidation between 10–50 Å thick is very common if the wafer is exposed to the ambient for any appreciable length of time prior to contact formation. Also, the inventors have noticed that many commercial fabrication processes do not completely etch away layer 200 and instead leave a thin unetched silicon oxide layer over the contact area. Such a layer is shown in FIG. 2B as layer 230 and may be between 100–250 Å thick or more depending on the process.

Depending on the thickness of this unetched layer 230 or any oxidation build-up on the wafer, the layer may prevent electrical contact from being made to the underlying substrate-surface when titanium layer 215 is deposited without the benefit of the present invention thereby resulting in a part failure that reduces the overall yield of the fabrication process. In other instances, layer 230 or the oxidation build-up is of a thickness that allows electrical contact to be made to the underlying silicon at an increased resistance level. Because of such, the manufactured device may not meet the manufacturer's performance requirements. In either of these cases, the pretreatment step of the present invention can be used to etch away all or a portion of the remaining layer 230 or the oxidation build-up thus enabling improved electrical contact to substrate 200. Further details of this aspect of the present invention are described below with respect to FIG. 3.

Figure 3:
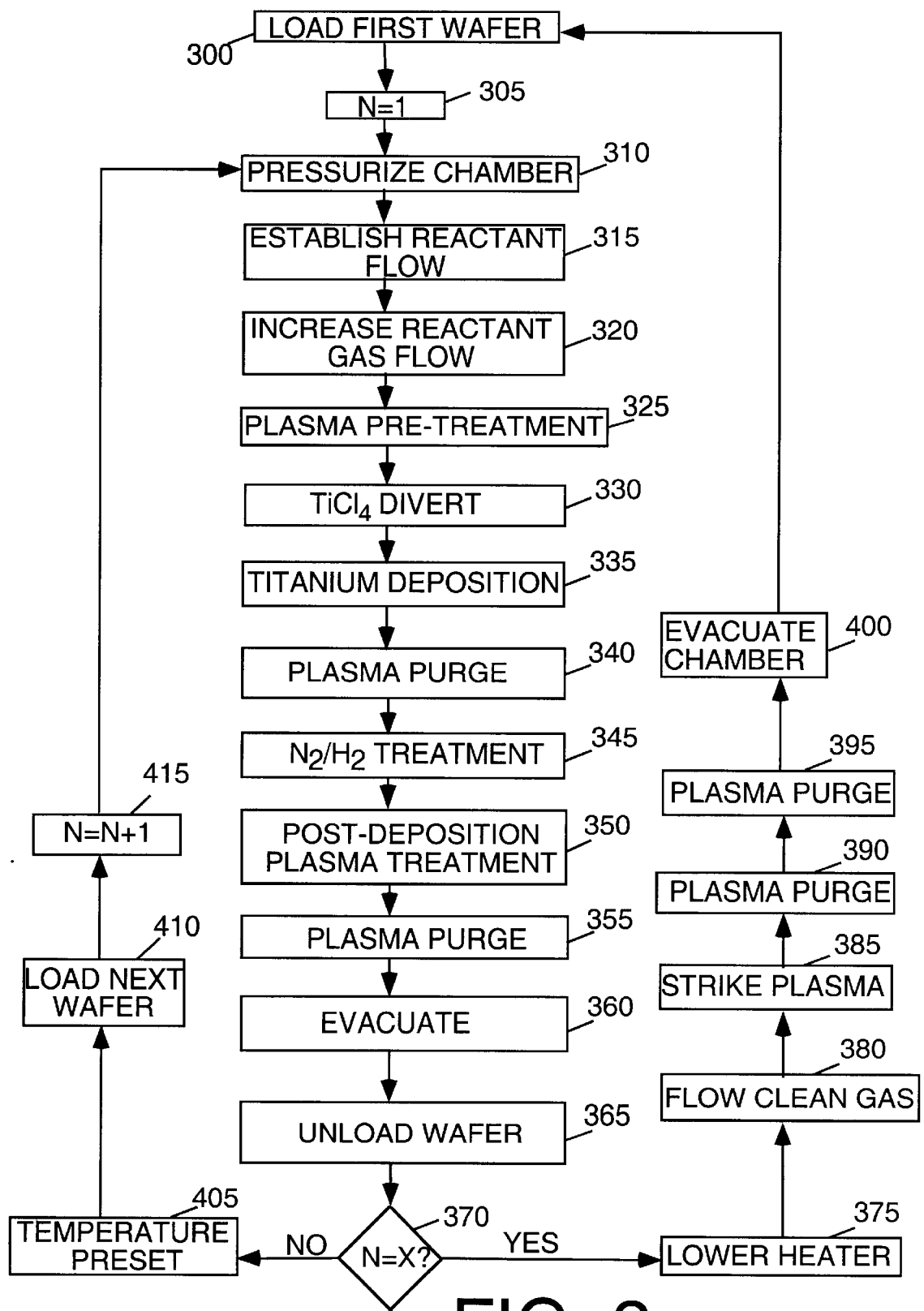
FIG. 3 is a flowchart of a process sequence used to deposit a titanium layer according to the currently preferred embodiment of the method of the present invention.

FIG. 3 is a flowchart detailing the steps undertaken to deposit a titanium film according to a preferred embodiment of the present invention. It is to be understood that the steps shown in FIG. 3 represent a preferred process only and that other embodiments of the invention may either skip some of the disclosed steps altogether or alter the format or sequence of the steps. As shown in FIG. 3, before deposition of the titanium layer can begin a wafer is loaded into chamber 30 (step 300) and processor 85 sets the current wafer count (N—used for cleaning purposes as discussed below) to 1 (step 305). After the wafer is loaded into the chamber, it is moved to a processing position where pedestal 32 is generally between 250 and 500 mils from gas distribution showerhead 40. In one specific and preferred embodiment, pedestal 32 is positioned 329 mils from showerhead 40. During this wafer positioning step, the chamber is pressurized with a non-corrosive gas, such as argon, above the pressure at which deposition will occur. The argon fills voids or hollow spaces within the chamber, particularly the interior of the heater pedestal, so that it will then outgas as the chamber pressure is subsequently reduced to the deposition pressure (5.0 torr in a specific embodiment). In this manner, step 310 minimizes the intrusion of process gases that may corrode or oxidize parts of the heater pedestal or chamber. The Ar pressurizing gas is flowed as an upper Ar flow through showerhead 40 and as a lower Ar flow from a point beneath wafer 36. Preferably the chamber pressure is set to between about 5–90 torr during this step.

Also during step 310, the pedestal temperature is set to between 15° C. of the actual process temperature. The process may be performed at any temperature between about 400–750° C., but preferably the pedestal temperature is set to between about 630–700° C. (corresponding to a wafer temperature of about 535–635° C.) and most preferably at about 680° C. (corresponding to a wafer temperature of about 605° C.) in a specific embodiment. In one specific embodiment, the temperature is initially set to about 690° C. (10° C. higher than the process temperature) in step 310 because the process gases will cool the heater and wafer when they start flowing. Initially heating the wafer above the process temperature results in a shorter wafer cycle time and reduces thermal shock to the heater arising from the thermal gradient between the heater element and the surface of the heater that conventionally arises when heater power is increased to bring the heater back up to processing temperature after the gas flows start.

About 10 seconds after the initiation of step 310, the temperature is reduced to the actual process temperature (which is then preferably maintained throughout the entire deposition process), a reactant gas (preferably $H_2$) flow is turned ON at an initial flow rate and the upper argon flow rate is increased (step 315). The reactant gas lowers the energy required for the decomposition of the source gas (introduced later) to form the desired film and also reduces the corrosivity of the deposition byproducts by converting some of the chlorine to hydrogen chloride (HCl) rather than leaving it as Cl or $Cl_2$. The flow of gases is then further increased 2 seconds later in step 320 and again 3 seconds later in step 325. The flow rate of the gases is stepped up in increments (or, alternatively, ramped) during steps 310 to 325 from an initial to a final flow rate in order to reduce the thermal shock to the heater; the final flow rate of the gases is fairly high and would unduly cool the wafer if turned on all at once. This stepped or ramped onset of gas is particularly important with gases such as helium or hydrogen, as these gases exhibit high thermal transfer characteristics.

The next step, step 325, is the plasma pretreatment step discussed above. In the plasma pretreatment step, low frequency (e.g., 300–450 KHZ, most preferably 350 KHz) RF energy is applied to showerhead 40 to form a plasma from the $H_2$ and argon process gas. As discussed above, this plasma either entirely or partially etches away any thin oxidation layer that has either grown on substrate 200 after the formation of contact hole 210 or any layer 230 that was left unetched within contact hole 210, thus enabling an improved electrical contact to substrate 200. It is believed that this etching process can be represented by the basic chemical reaction of: $SiO_2 + H_2 \rightarrow SiH_4 + H_2O$ where the silane ($SiH_4$) and water ($H_2O$) are both exhausted from the chamber. Of course it is believed that other intermediate reactions take place and that the exhausted compounds also contain ions and other molecules from these intermediate reactions.

It is possible to use other gases, referred to as pretreatment gases, in step 320 to etch away oxidation build-up or left over silicon oxide. The pretreatment gas should exhibit a high etch selectivity between silicon oxide and the silicon substrate so that it can etch the oxidation or left over oxide without damaging the silicon contact area. Other pretreatment gases that can be used in step 320 include ammonia ($NH_3$) and various halogen species that are known to etch silicon oxide. Fluorine-containing gases (e.g., $CHF_3$, $CF_4$, $C_2F_6$, $BF_3$, $NH_3$ and like) are believed to be the most preferred halogen species while iodine-containing sources are believed to be the least preferred because most iodine sources are solids at room temperature and are difficult to work with. Also, bromine-containing species are generally preferred over chlorine-containing species in that the bromine gases are believed to have less of an effect on the subsequent deposition process. Any of the pretreatment gases can be, and preferably are, mixed with a carrier or another inert gas to help stabilize the plasma and the resulting etching process.

The $TiCl_4$ (source gas) and helium flows are also initiated during step 325. Instead of introducing these flows into chamber 30 at this time, however, these flows are diverted directly to the foreline. Diverting the flows in this manner, particularly the flow of $TiCl_4$, allows the flows to stabilize before deposition begins thus improving the uniformity of processing conditions among the various titanium deposition steps in a multi-wafer deposition sequence (e.g., a 2000 wafer run). Optionally, the $TiCl_4$ and helium flows can be started shortly after the initiation of the plasma as part of a separate step 330. In either case it is preferred that the $TiCl_4$ flow be stabilized for between at least 6–8 seconds prior to deposition step 335.

In deposition step 335, the $TiCl_4$ and helium gas flows are redirected to flow into chamber 30 along with the argon and $H_2$ flows, and the plasma is maintained by continuing to apply RF power to showerhead 40. $TiCl_4$ is in liquid form and is vaporized using a liquid injection system such as the gas panel precision liquid injection system (GPLIS) manufactured by STEC Corporation before being mixed with the helium carrier gas. As shown in Table 1 below, in the currently preferred embodiment, the ratio of $H_2$ to $TiCl_4$ is 106:1. This ratio is can be calculated by converting the $TiCl_4$ mgm flow rate given in the table to its equivalent sccm rate as can be done by a person of ordinary skill in the art. In this instance, $TiCl_4$ is introduced at a rate of 400 mg/m, which is equivalent to a gaseous flow rate of 47.23 sccm.

Deposition step 335 is maintained as long as required to deposit a film of selected thickness. Because. of the high deposition temperature, increased gas flow rates and other factors, the titanium film of the present invention is deposited at deposition rates of at least 100 Å/minute and up to about 400 Å/minute or higher. Thus, the overall time of step 335 is generally lower than that required by prior art processes, which in turn leads to increased wafer throughput.

After the completion of deposition step 335, the $H_2$, $TiCl_4$ and helium flows are turned OFF, the RF power is dramatically reduced, and the upper argon flow is dramatically reduced (step 340) in order to loosen any large particles that may have formed on the chamber during the deposition step. Next about 3 seconds later, RF power is switched OFF and the titanium layer may be passivated. The titanium layer is passivated by forming a thin layer of titanium nitride at the titanium layer's surface such that impurities such as carbon and oxygen cannot be absorbed into the titanium. Such impurities can alter the resistance of the titanium layer and form an unsuitable surface for titanium nitride barrier layer deposition. Passivation may be accomplished by adding a flow of $H_2$ and a flow of $N_2$ to the argon flow as a passivation step 345 and/or forming a nitrogen plasma in a step 350. Preferably, both steps 345 and 350 are performed. When done in this manner, step 345 helps stabilize the chamber before post-deposition plasma treatment step 350 and purge $TiCl_4$ residue from the chamber. Also, the nitrogen reacts with the surface titanium to begin to form a thin layer of titanium nitride.

After step 345, the titanium layer is further passivated at step 350 by applying RF energy to the $H_2/N_2/Ar$ passivation gases in the chamber to form a plasma. The passivation plasma may alternatively be formed in a remote plasma source and channeled to the chamber. The ionized nitrogen in the passivation plasma reacts with the surface of the titanium layer to complete the formation of a thin layer of titanium nitride during approximately 10 seconds of exposure. To form the plasma in the chamber, RF power is generally applied to the showerhead 40. However, the RF power may be applied to the pedestal electrode 22 or to both the pedestal electrode 22 and the showerhead 40. In the preferred embodiment where both steps 345 and 350 are employed, step 345 lasts for about 8 seconds. In other embodiments where only step 345 or only step 350 are used, the steps may be employed longer, e.g., between about 10–30 seconds.

After step 350 a second plasma purge step 355 is performed to further loosen any large particles that may be present in the chamber. Plasma purge step 355 is similar to plasma purge step 340, except that $N_2$ and $H_2$ flows are maintained in step 355 in addition to the argon flows. Finally, in step 360, all gas flows are shut off and the chamber is evacuated and then the wafer is unloaded from the chamber (step 365). Since the wafer has been, in general, passivated, the wafer can be exposed to the air without the titanium layer detrimentally absorbing impurities such as oxygen and carbon. As such, even long term exposure to air, e.g., days of exposure, does not degrade the properties of the titanium layer. Furthermore, the titanium nitride passivation layer provides a "clean" surface upon which subsequent processing can deposit a titanium nitride barrier layer. After the wafer is removed, the temperature is preset to about 680° C. (step 405) before the next wafer is loaded (step 410) and processor 85 increases the wafer count (step 415).

In addition to the plasma purge clean steps 340 and 355 performed after each wafer deposition, a dry clean process (which is done without opening the chamber lid) is performed periodically on the chamber after a certain number of wafer deposition processes to further avoid wafer contamination. According to the present invention, there is no wafer (e.g., a dummy wafer) in the chamber during this clean process. The dry clean process is generally run between every "X" wafers, preferably between every 2–300 wafers. The dry clean may be performed, for example, between every 3–5 wafers in a specific embodiment. It is desired to keep the dry clean process efficient, so that it does not significantly affect the total system wafer output. A preferred dry cleaning process in accordance with a specific embodiment is described in further detail below.

Referring again to FIG. 3, if X (where X=3, for example) wafers have been processed (step 370), the chamber is due for a dry clean. First, the heater is moved further away from the showerhead to a distance of about 650 mil (step 375), and maintained at the processing temperature of 680° C. At this time, $N_2$ or similar nonreactive gas is flowed into the chamber and the chamber is maintained at a cleaning pressure ranging between about 0.1–10 torr, preferably less than about 5 torr, and about 0.6 torr in a specific embodiment. This minimizes heat flow from the heater to the showerhead, thus cooling the showerhead relative to the heater.

Three seconds after step 375, chlorine gas ($Cl_2$) is flowed into the chamber at a rate of about 250 sccm, and the pedestal is raised to 600 mil from the showerhead 40 (step 380). Next, two seconds later, a plasma is struck at a power of about 400 watts (step 385). This condition is held for a set period of time to allow for the chlorine species to react with unwanted deposits and etch the deposits from the chamber components. Unwanted deposits from the deposition processes are generally thickest over the hottest exposed portions of the chamber, i.e., the top surfaces of the heater that were not covered by a wafer or not shielded by a flow restrictor ring. By moving the heater away from the showerhead, the conditions given above ensure sufficient cleaning of all chamber components without overetching any of those components, especially the showerhead.

The length of step 390 depends on the amount of deposition build-up within chamber 30, which in turn depends on how many wafers are processed between dry clean operations and the length of the deposition process (i.e., thickness of the titanium film deposited over wafer 36) among other factors. In one specific embodiment, step 390 lasts for 15 seconds. Alternatively, the length of step 390 can be determined using a cleaning endpoint technique. Such techniques are well known and include optical endpoint detection methods and pressure-based endpoint detection methods. Optical endpoint detection requires a quartz or similarly opaque window in the wall of chamber 30 for proper operation and is less preferred in some embodiments because such a window is susceptible to titanium deposition that interferes with proper endpoint detection. Similarly, known pressure-based endpoint detection methods are also less than ideal because such pressure-based endpoint detection methods must be individually calibrated to each chamber 30 to properly and precisely identify the end of clean step 390.

Figure 4:
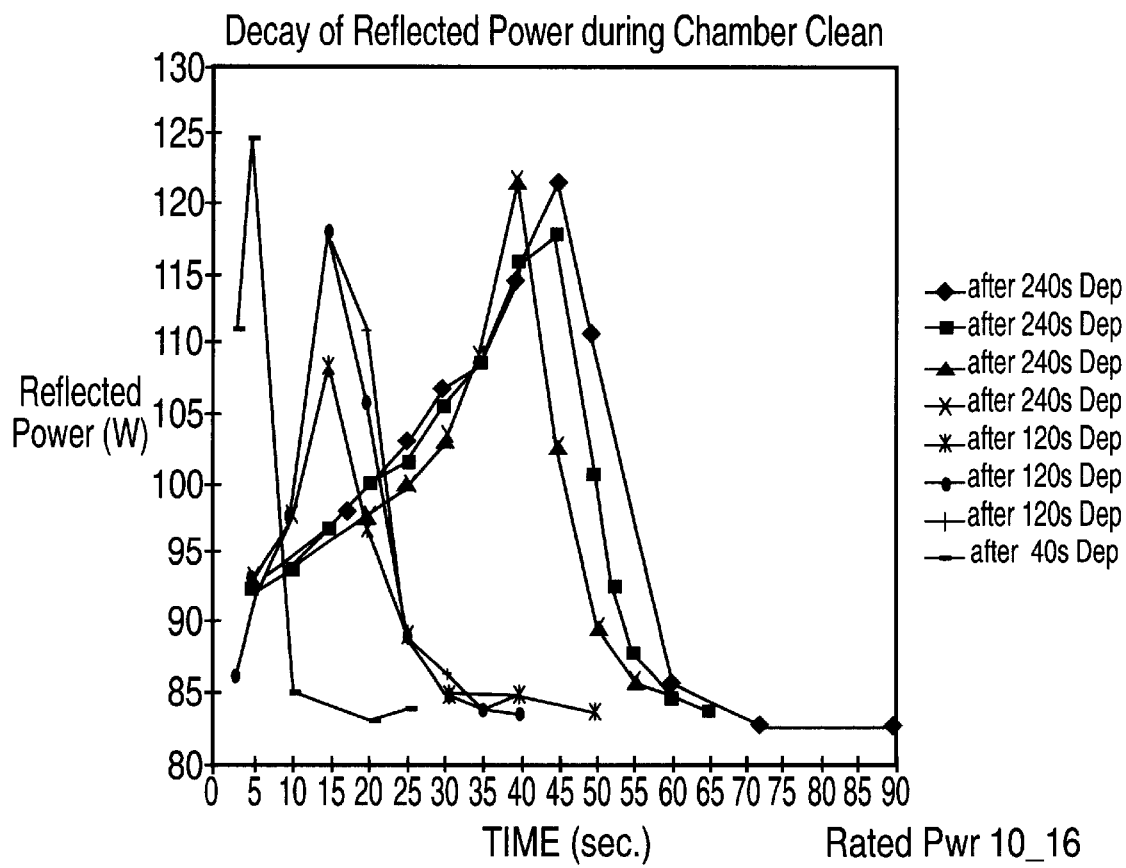
FIG. 4 is a graph showing measured reflected power as a function of time and deposition length during a chamber clean step.

Accordingly, the present inventors have developed a new endpoint detection scheme for step 390 that is based on measured reflected RF power. This endpoint detection scheme measures power reflected from chamber 30 onto the power supply lines for RF power supply 5 (FIG. 1A) throughout the entire clean step 390. At the beginning of clean step 390, the reflected power increases as deposits are etched from the chamber walls. This increase in reflected power represents the increased density of the cleaning plasma as it incorporates ionic species and energetic molecules from the etched-away titanium deposits. As more and more deposited material is etched from the chamber walls, the measured reflected power reaches a peak before it starts to fall. These observations are evident in FIG. 4, which is a graph showing measured reflected power throughout clean step 390 as a function of time and the length of titanium deposition step 335. The data shown in FIG. 4, represents an embodiment where x=1, that is, where chamber 30 was subjected to a dry clean process after a single wafer is processed.

The chamber clean process is completed when the measured reflected power decreases at a de minimis rate or below. For example in one embodiment, step 390 is stopped seconds after the rate of decrease of the measured reflected power declines to 0 Watts/second. In another embodiment step 390 is stopped when the rate of decrease of measured reflected power reaches 2 Watts/second or less.

After the plasma clean, the chlorine gas is turned off and the plasma power is switched OFF (step 390). $N_2$ flow is maintained to purge the chamber for about 3 seconds. The pedestal is then returned to about 650 mil spacing (step 395) and the bottom argon flow is increased for 10 seconds to further purge the chamber. Finally, the chamber is pumped out for about 5 seconds (step 400). of course, it is recognized that "wet cleans" or preventive maintenance cleanings (occurring between every hundreds to thousands of processed wafers) may be performed by opening the chamber lid to manually clean various parts of the chamber.

Performing the periodic dry clean process between wafer depositions minimizes the frequency of these wet clean preventive maintenance, which are often very time consuming, and provides a cleaner chamber, which in turn is believed to increase the efficiency of the deposition process and contribute to faster deposition rate. Further, employing the periodic dry clean process improves the repeatability of the titanium deposition process over an extended wafer run. That is, during an extended wafer run of, for example, 2000 wafers, the properties of the deposited titanium layers over the first dozen wafers are much more similar to the properties of the deposited layers over the last dozen wafers as compared to an extended wafer run in which such periodic dry cleaning was not employed.

The present inventors also discovered that liquid $TiCl_4$ left in the gas line after the $TiCl_4$ flow is stopped (step 340) interferes with process repeatability. That is, when the $TiCl_4$ flow is stopped in deposition step 340 by shutting off the appropriate flow control valve connected to the line, some residual $TiCl_4$ liquid remains in the line. The present inventors have found that the amount of this residual liquid varies from one deposition process to the next and that the residual $TiCl_4$ can cause deposition instabilities and otherwise adversely affect the deposition process. For example, because the amount of residual $TiCl_4$ varies, the amount of $TiCl_4$ that is flowed into the chamber for any two individual substrates in an extended wafer run may be different, which in turn can result in more or less deposition on a particular substrate. Also, the residual $TiCl_4$ may react with moisture present on a new substrate as it is transferred into the chamber to form $TiO_2$ and create unwanted particles. Finally, the residual $TiCl_4$ may leak into the chamber between wafer deposition steps and coat portions of the chamber or chamber components thereby changing the color of the coated portion, which also changes the emissivity of that portion of the chamber or component. A change in the emissivity of a surface may undesirably change the temperature or other properties of the surface.

In order to combat the ill-effects of this residual $TiCl_4$, the inventors have devised a novel and unique step that dries the $TiCl_4$ gas line by flowing helium or another inert gas source (a gas that does not react with the residual $TiCl_4$) through the line during the dry clean process. For example, in each of steps 375 through 395, a 500 sccm flow of helium can be introduced into the $TiCl_4$ line to dry out and purge the residual $TiCl_4$ from the line. In this manner, the method of the present invention ensures that the gas line is in a reproducible state prior to the deposition on every wafer. Also, after purging the $TiCl_4$ line, the flowed helium is routed to the deposition chamber where it helps stabilize the dry cleaning plasma. The helium flow is routed through the $TiCl_4$ line through the use of appropriate valves and flow controllers as would be understood by a person of ordinary skill in the art.

Gas flow rates, pressure levels and other information according to the currently preferred embodiment of the present invention described with respect to FIG. 3 above are set forth in Table 1 (deposition process) and Table 2 (cleaning process) in FIGS. 6 and 7 respectively. The gas introduction rates set forth in Tables 1 and 2 are based on utilizing the process shown in FIG. 3 in a resistively heated TixZ CVD chamber manufactured by Applied Materials that is outfitted for 8-inch wafers. As a person of ordinary skill in the art would understand, the actual rates at which gases are introduced in other embodiments will vary if other chambers of different design and/or volume are employed.

While the deposition conditions and flow rates shown in Table 1 and 2 above represent the flow rates employed in the currently preferred embodiment of the present invention, it is recognized that other deposition conditions and other flow rates can be used. For example, with respect to the rate at which the source and reactant gases are introduced during the deposition stage, the inventors discovered that the ratio of $H_2$ to $TiCl_4$ should be between about 64:1 and 2034:1. The preferred ratios depend in part on other deposition conditions including deposition temperature, pressure, pedestal spacing, RF power level and other factors. The present inventors have discovered, however, that the ratios set forth above can be used to deposit titanium films of good quality over preferred deposition conditions including a heater temperature range of at least 630–700° C. and a deposition pressure range of at least 1–10 torr. In certain specific tests, titanium films of good quality were deposited at a 64:1 $H_2/TiCl_4$ ratio using an $H_2$ flow of 3000 sccm with a $TiCl_4$ flow rate of 400 mg/m (equivalent to 47.23 sccm) and at a 2034:1 $H_2/TiCl_4$ ratio using an $H_2$ flow rate of 12,000 sccm and a $TiCl_4$ flow rate as low at 50 mg/m (equivalent to 5.9 sccm). At $H_2/TiCl_4$ flow ratios of less than 64:1, the reaction becomes hydrogen starved and becomes unstable, while at flow ratios of greater than 2034:1, the deposited films start to exhibit unacceptably poor bottom coverage in the contact and it becomes difficult to manage the exhaust.

IV. Test Results and Measurements

To show the effectiveness of the present invention, experiments were performed depositing titanium layers with and without the benefits of the method of the present invention. The experiments were performed in a resistively-heated TixZ chamber manufactured by Applied Materials. The TixZ chamber was outfitted for 200-mm wafers and was situated in a Centura multichamber substrate processing system also manufactured by Applied Materials.

In one of these sets of experiments, various pretreatment steps (step 325) were performed prior to the titanium deposition step to a wafer having a silicon oxide layer deposited thereon. The first of these pretreatment steps formed a plasma from a $Cl_2$ (125 sccm), $N_2$ (500 sccm) and Ar (200 sccm) process gas. The plasma was formed using an RF power level of 400 W and was maintained for between 40 and 100 seconds in different tests. Test results showed this step etched the silicon oxide layer at a rate of 1.1 C/sec., but that the etching was not very uniform and was rather uncontrolled and tenacious etching away silicon in addition to the silicon oxide.

Further tests showed that chlorine-from the $Cl_2$ plasma pretreatment step interfered with the subsequent titanium deposition step. Specifically, it is believed that residual chlorine was responsible for slowing down the deposition rate of the titanium film in step 335. It was also determined that the resulting titanium layer was less uniform than titanium layers deposited without a $Cl_2$ plasma pretreatment step.

Figure 5A:
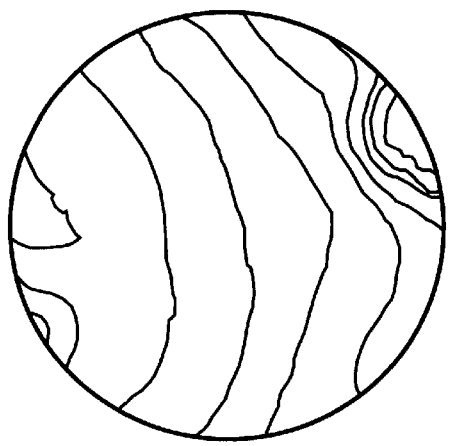
FIGS. 5A and 5B are film thickness measurements illustrating experimental results of the present invention.
Figure 5B:
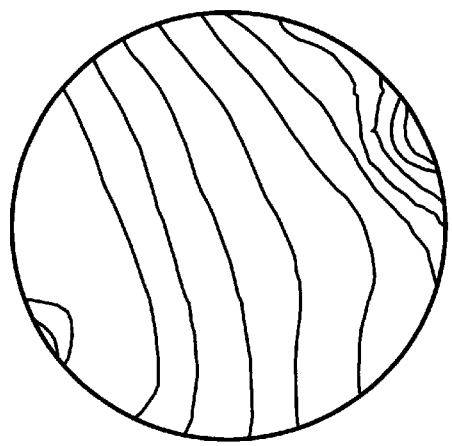

The inventors also tested the plasma pretreatment step using $H_2$ according to the currently preferred embodiment of the present invention. The results of these tests indicated that the $H_2$ (12 slm) and Ar (5500 sccm) plasma (RF power 900 W) uniformly etched the silicon oxide at a rate of about 0.8 C/sec. Also, the etch process was relatively gentle in that it did not show any signs of damaging the silicon. FIGS. 5A and 5B show illustrate the etch uniformity using this treatment. FIG. 5A shows the thickness of the silicon oxide layer deposited over the wafer before results of a wafer before being subjected to the plasma pretreatment step of the present invention. The measurements were made using a Rudolph Focus Ellipsometer as well known to those of skill in the art and they show that prior to the pretreatment step, the oxide layer had a thickness of 132" 15.61 C. FIG. 5B, represents the thickness of the oxide layer immediately after a 90 second pretreatment step. In FIG. 5B, the oxide layer has a thickness of 58" 16.7 C. As evident from a comparison of FIGS. 5A to 5B, the thickness variation of the oxide layer in FIG. 5B is almost identical to the variation shown in FIG. 5A. Thus, it is clear from this comparison that the etch of this step 325 was very uniform.

Also, the present inventors measured the resistivity of titanium layers deposited according to present invention and titanium layers deposited according to a similar process, but without the plasma pretreatment step and without a standard HF dip step, which would normally is commonly used by semiconductor manufacturers to remove oxidation prior to titanium deposition. The results of these tests showed that for a 300 Å titanium layer, the resistivity of the layer was between 0.5 and 1.0 S/G higher for the titanium films not if processed with the plasma pretreatment step as compared to those processed with the plasma pretreatment step.

These results prove that the plasma pretreatment step of the present invention can be successfully used to etch away unwanted oxidation on a silicon substrate prior to the deposition of a titanium layer. As previously mentioned, such oxidation is routinely built-up on substrates and would previously require a separate processing step such as a dip in an HF solution to etch away the build-up prior to transferring the substrate to a separate chamber for deposition of the titanium film. Such an HF dip step requires that the wafer be dried afterwards and then immediately transferred to the deposition chamber before further oxidation occurs. This process is cumbersome, time consuming and inherently less reliable than the process of the present invention.

Other tests showed that the process of the present invention does not deposit any titanium on the sidewalls of a contact hole such as hole 210 (FIG. 2A) while resulting in bottom coverage of greater than 300%. A film exhibiting bottom coverage of 300% has 300 Å of titanium silicide formed at the bottom of the contact when a 100 Å titanium layer is deposited within the contact.

The parameters listed in the above process and experiments should not be limiting to the claims as described herein. One of ordinary skill in the art can modify the process described above by using chemicals, chamber parameters, and conditions other than those described with respect to the preferred embodiments. As such, the above description is illustrative and not restrictive and the present invention is applicable to depositing titanium films in a variety of different deposition and cleaning processes. For example, the dry cleaning process can employ remote plasma system 4 to dissociate $Cl_2$ gas molecules and/or other gases. Similarly, remote microwave plasma system 4 can be used to dissociate titanium and other process gas molecules during the deposition process and the dissociated ions can be channeled to chamber 30. The present invention can be used with different cleaning sources including $F_2$, $ClF_3$ and others, and the techniques of the present invention can be employed with different titanium sources, for example, $TiI_4$ (a solid) and any other titanium halide compound. Also, plasma pretreatment step 325 can be used to heat the wafer and stabilize temperature uniformity across the wafer prior to the deposition step. And other gases, for example, $N_2$ above or $NH_3$, can be used to passivate the titanium layer in steps 345 and 350. The scope of the invention should, therefore, be determined not with reference to the above description, but instead should be determined with reference to the appended claims along with their full scope of equivalents.

Although various embodiments which incorporate the teachings of the present invention have been shown and described in detail herein, those skilled in the art can readily devise many other varied embodiments that still incorporate these teachings.

What is claimed is:

1. A method for passivating a layer of titanium that has been deposited on a substrate in a reaction chamber, comprising the step of:
   (A) adding a flow of hydrogen and a flow of nitrogen to the chamber in the absence of a plasma.

2. The method of claim 1, wherein said flows of hydrogen and nitrogen are each approximately 800 sccm.

3. The method of claim 1, wherein said flows of hydrogen and nitrogen each continue for approximately 10–30 seconds.

4. The method of claim 1 wherein said layer of titanium has been deposited by CVD.

5. A method for passivating a layer of titanium that has been deposited on a substrate in a reaction chamber, comprising the steps of:
   (A) forming a thin layer of titanium nitride by supplying a flow of hydrogen and a flow of nitrogen to the reaction chamber in the absence of a plasma; and
   (B) exposing the substrate to a plasma comprising nitrogen in the chamber.

6. The method of claim 5, wherein said plasma is a nitrogen plasma.

7. The method of claim 5, wherein said flows of hydrogen and nitrogen are each approximately 800 sccm.

8. The method of claim 5, wherein said flows of hydrogen and nitrogen each continue for approximately 8 seconds.

9. The method of claim 5, wherein said plasma continues for approximately 10 seconds.

10. The method of claim 5, wherein said plasma is formed by applying RF power to an electrode located within said chamber.

11. The method of claim 5 wherein said plasma is formed in a remote plasma source and channeled to said reactor chamber.

* * * * *